United States Patent
Li

(10) Patent No.: US 9,385,343 B2
(45) Date of Patent: Jul. 5, 2016

(54) ORGANIC LIGHT-EMITTING DIODE DISPLAY PANEL

(71) Applicant: EverDisplay Optronics (Shanghai) Limited, Shanghai (CN)

(72) Inventor: Zheng Li, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/338,828

(22) Filed: Jul. 23, 2014

(65) Prior Publication Data

US 2015/0364725 A1 Dec. 17, 2015

(30) Foreign Application Priority Data

Jun. 16, 2014 (CN) .......................... 2014 1 02654128

(51) Int. Cl.
*H01L 51/52* (2006.01)
(52) U.S. Cl.
CPC .................................. *H01L 51/5284* (2013.01)
(58) Field of Classification Search
CPC . H01L 27/3246; H01L 27/32; H01L 51/5284; H01L 51/5262
USPC .................................................. 313/498–512

See application file for complete search history.

(56) References Cited

U.S. PATENT DOCUMENTS

| 6,307,528 | B1* | 10/2001 | Yap ................................ 345/45 |
| 7,291,970 | B2* | 11/2007 | Kuwabara ...................... 313/504 |
| 2005/0264178 | A1* | 12/2005 | Lan et al. ....................... 313/503 |
| 2010/0019668 | A1* | 1/2010 | Koo .............................. 313/504 |

* cited by examiner

*Primary Examiner* — Donald Raleigh
*Assistant Examiner* — Kevin Quarterman
(74) *Attorney, Agent, or Firm* — Wang Law Firm, Inc.

(57) ABSTRACT

An organic light-emitting diode display panel includes a substrate on which an OLED (organic light-emitting diode) light-emitting element is mounted. The OLED light-emitting element includes an OLED organic layer. A black silicon structure is disposed on the substrate and reveals the OLED organic layer. The black silicon structure absorbs ambient light to reduce the reflectance of the ambient light. By disposing the black silicon structure around the OLED organic layer or by directly forming the OLED organic layer in the black silicon structure, the extremely high light absorbing capability of the black silicon structure is used to significantly reduce the reflectance of the ambient light. A clear display effect in a bright environment can be achieved under smaller luminance, reducing the luminance of the display panel and saving the power consumption. Furthermore, the number of films and the overall thickness of the panel can be reduced.

6 Claims, 2 Drawing Sheets

ORGANIC LIGHT-EMITTING DIODE DISPLAY PANEL

CROSS-REFERENCE TO RELATED APPLICATION

This applicant claims the benefit of priority to CN 201410265412.8, filed with the State Intellectual Property Office of the People's Republic of China on Jul. 16, 2014, the entire specification of which is hereby incorporated in this application by reference.

BACKGROUND OF THE INVENTION

The present invention relates to a display panel and, more particularly, to an organic light-emitting diode (OLED) display panel.

Organic light-emitting diode (OLED) display panels, also referred to as "organic electroluminescent display panels, are new flat panel displays having a promising application due to advantages of simple production, low cost, low power consumption, high luminance, wide operating temperature range, high speed response, ease of color display, large display area, easy match with integrated circuit drivers, and ease of flexible display.

With reference to FIG. 5, an OLED display panel generally includes a substrate 1, a semiconductor layer 2 (also referred to as "ITO layer") on the substrate 1, an electrode layer 6 on the semiconductor layer 2, and a structure layer between the semiconductor layer 2 and the electrode layer 6. The semiconductor layer 2 is electrically connected to a positive pole to form an anode. The electrode layer 6 is electrically connected to a negative pole to form a cathode. The structure layer includes a hole transporting layer (HTL) 3 connected to the semiconductor layer 2, an electron transporting layer (ETL) 5 connected to the electrode layer 6, and an emissive layer (EL) between the hole transporting layer 3 and the electron transporting layer 5. When a suitable voltage is applied to the semiconductor layer 2 and the electrode layer 6, electron holes generated in the anode combine with electrons generated in the cathode to emit photons. Red, green, and blue (the three basic colors) lights can be generated according to different formulations.

Since the electrode layer 6 is generally made of metal and, thus, has a high reflectivity, an OLED display panel has poor readability due to reflection of light when used in a bright, outdoor environment.

In this industry, a circular polarizer (consists of a linear polarizer and a quarter wave plate) is used to reduce the reflectance of the ambient light. However, the circular polarizer is expensive. Furthermore, the ambient light is not a monochromatic light. Furthermore, in addition to passing through the linear polarizer and the quarter wave plate, the ambient light also passes through the material and the middle structure of the OLED such that a portion of purified linearly polarized light turns into elliptically polarized light, and a large portion of light is, thus, reflected, failing to provide a complete blocking effect. In a bright environment, the luminance of the OLED must be increased to improve the readability at the cost of an increase in the power consumption. Furthermore, more than 50% of the light output of the OLED is lost after passing through the polarizer, which is a great loss. Further, the service life of the panel is shortened under high luminance. Further, the thickness of the polarizer is about 0.2 mm, which does not meet the trend of thinning of OLED display panels.

BRIEF SUMMARY OF THE INVENTION

An objective of the present invention is to overcome the disadvantages of poor isolation of reflected light, high power consumption, and incapability in reducing the thickness of panels in the current techniques by providing an organic light-emitting diode display panel.

The technical solution to fulfill the above objective is an organic light-emitting diode (OLED) display panel according to the present invention including a substrate. An organic light-emitting diode (OLED) light-emitting element is mounted on the substrate. The OLED light-emitting element includes an OLED organic layer. A black silicon structure is disposed on the substrate and reveals the OLED organic layer. The black silicon structure is adapted to absorb ambient light to reduce the reflectance of the ambient light.

A black silicon structure is additionally provided by using the above organic light-emitting diode display panel. By disposing the black silicon structure around the OLED organic layer or by directly forming the OLED organic layer in the black silicon structure, the extremely high light absorbing capability of the black silicon structure is used to significantly reduce the reflectance of the ambient light, a clear display effect in a bright environment can be achieved under smaller luminance, reducing the luminance of the display panel and saving the power consumption. Furthermore, the number of films and the overall thickness of the panel can be reduced, and potential light interference from an adjacent OLED organic layer can be avoided, meeting the trend of thinning the panels.

Further improvement of the OLED display panel according to the present invention is that the black silicon structure is a black silicon layer disposed on the OLED light-emitting element, and the black silicon structure includes an opening to reveal the OLED organic layer below the black silicon layer.

Further improvement of the OLED display panel according to the present invention is that the black silicon structure is a black silicon layer on a same level as the OLED organic layer, and the black silicon layer is located around the OLED organic layer.

Further improvement of the OLED display panel according to the present invention is that the OLED organic layer is formed in the opening of the black silicon structure by evaporation deposition.

Further improvement of the OLED display panel according to the present invention is that the OLED organic layer is disposed in the black silicon structure, and the black silicon structure is a plurality of black silicon cones protruding beyond the OLED organic layer.

Further improvement of the OLED display panel according to the present invention is that the black silicon structure is formed on a silicon plate by etching, and the black silicon structure includes a surface having a micro structure with a geometric shape.

Further improvement of the OLED display panel according to the present invention is that a visible light reflectance of the black structure is smaller than 1%.

Further improvement of the OLED display panel according to the present invention is that the geometric shape of the micro structure is of a peak shape.

DETAILED DESCRIPTION OF THE INVENTION

In current technique, an organic light-emitting diode (OLED) display panel generally uses a circular polarizer (consists of a linear polarizer and a quarter wave plate) to reduce the reflectance of the ambient light. However, the circular polarizer is expensive, and the blocking effect is insufficient. Furthermore, the luminance of the OLED in a bright environment must be increased to improve the readability at the costs of an increase in the power consumption and shortened service life of the display panel.

In view of these disadvantages, the inventor of the present invention provides an organic light-emitting diode (OLED) display panel including a substrate. An organic light-emitting diode (OLED) light-emitting element is mounted on the substrate. The OLED light-emitting element includes an OLED organic layer. A black silicon structure is disposed on the substrate and on a top surface of an organic blocking layer yet still reveals the OLED organic layer. The black silicon structure is adapted to absorb ambient light to reduce a reflectance of the ambient light.

By the above technical solution, in the organic light-emitting diode display panel provided by the present invention, by disposing the black silicon structure around the OLED organic layer or by directly forming the OLED organic layer in the black silicon structure, the extremely high light absorbing capability of the black silicon structure is used to significantly reduce the reflectance of the ambient light, saving power consumption and meeting the trend of thinning the panels.

Other advantages and effects of the present invention disclosed in the specification can easily be appreciated by a person skilled in the art through specific illustrations of specific embodiments of the present invention. The present invention can be implemented or applied through different embodiments. Furthermore, the details of the present invention can be varied according to different aspects and applications, and various modifications and changes can be made without departing from the spirit of the present invention.

It is noted that all figures of the embodiments merely illustrate the basic concepts of the present invention in a schematic manner. Thus, the figures merely show the components related to the present invention and are not drawn according to the specific number, shape, and size of the components in practice. The types, number, and ratio of the components in practice can be varied if desired, and the layout of the components could be more complicated.

The present invention will be further described in connection with the accompanying drawings and specific embodiments.

First Embodiment

Figure 1:
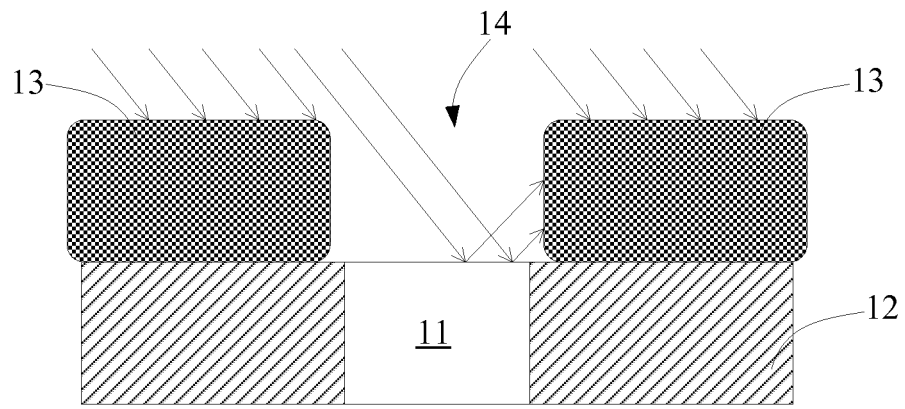
FIG. 1 is a schematic structural view of an organic light-emitting diode display panel of a first embodiment according to the present invention.
Figure 2:
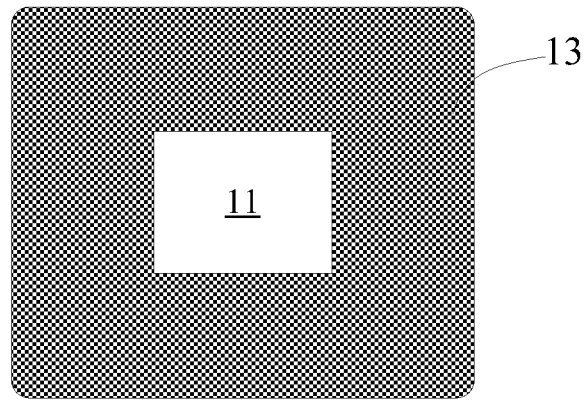
FIG. 2 is a top view of the organic light-emitting diode display panel of FIG. 1.

Please refer to FIGS. 1 and 2, wherein FIG. 1 is a schematic structural view of an organic light-emitting diode display panel of a first embodiment according to the present invention, and FIG. 2 is a top view of the organic light-emitting diode display panel of FIG. 1. As shown in FIGS. 1 and 2, the organic light-emitting diode display panel according to the present invention includes a substrate on which an OLED (organic light-emitting diode) light-emitting element is mounted. The OLED light-emitting element includes an OLED organic layer 11. An organic blocking layer 12 is disposed around the OLED organic layer 11 to surround the OLED organic layer 11. Furthermore, a black silicon layer 13 is disposed on the OLED organic blocking layer 12 and without contact with the OLED organic layer 11. The black silicon layer 13 includes an opening 14 to reveal the OLED organic layer 11 below the black silicon layer 13, allowing light to emit from the OLED organic layer 11. In practice, the black silicon layer 13 can be formed on the organic blocking layer 12. Next, the opening 14 can be formed in a location of the black silicon layer 13 corresponding to the organic blocking layer 12 by etching. Then, the OLED organic layer 11 can be formed by evaporation deposition.

In this embodiment, the OLED organic layer 11 is used as a light-emitting zone. The light can be white or any one of red, green, and blue. The black silicon layer 13 is excellent in absorbing light to significantly reduce the reflectance of the ambient light. In fact, the black silicon is formed by etching a silicon plate and includes a surface having a micro structure with a geometric shape. Preferably, the geometric shape of the micro structure is of a peak shape. The etching can include femtosecond laser pulse irradiation, metal-assisted wet etching, reactive ion etching, and electrochemical etching. The etched portion of the surface of silicon turns from gray into black, which means black silicon is better than ordinary silicon in light absorption. After experimental measurement, black silicon after etching almost absorbs all of the light from visible light region to infrared light region (the reflectance can be smaller than 1%).

Second Embodiment

Figure 3:
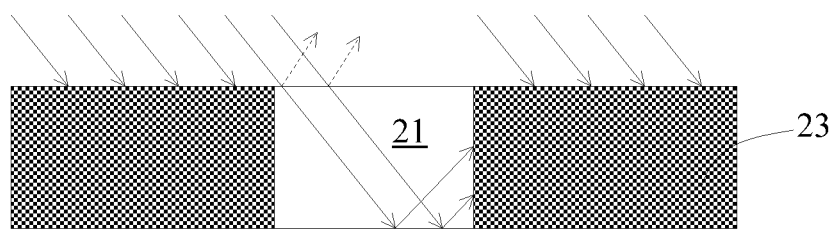
FIG. 3 is a schematic structural view of an organic light-emitting diode display panel of a second embodiment according to the present invention.

Please refer to FIG. 3 which is a schematic structural view of an organic light-emitting diode display panel of a second embodiment according to the present invention. As shown in FIG. 3, the organic light-emitting diode display panel according to the present invention includes a substrate on which an OLED (organic light-emitting diode) light-emitting element is mounted. The OLED light-emitting element includes an OLED organic layer 21. A black silicon layer 23 is disposed around the OLED organic layer 21. In this embodiment, the black silicon layer 23 and the OLED organic layer 21 are on the same level. In practice, the black silicon layer 23 is firstly formed. Next, an opening is formed in the black silicon layer 23 by etching. Then, the OLED organic layer 21 is formed in the opening of the black silicon layer 23 by evaporation deposition.

Specifically, in the second embodiment, the black silicon layer 23 and the OLED organic layer 21 are on the same level. Compared to the first embodiment in which the black silicon layer 13 is located on the OLED organic layer 11, the black silicon layer 23 can reduce the number of films and the overall thickness of the panel and can avoid potential light interference from an adjacent OLED organic layer while having excellent light absorbing capability to significantly reduce the reflectance of the ambient light.

Third Embodiment

Figure 4:
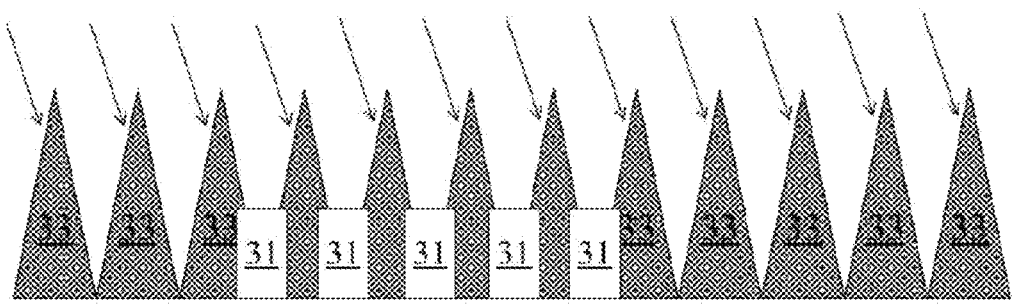
FIG. 4 is a schematic structural view of an organic light-emitting diode display panel of a third embodiment according to the present invention.
Figure 5:
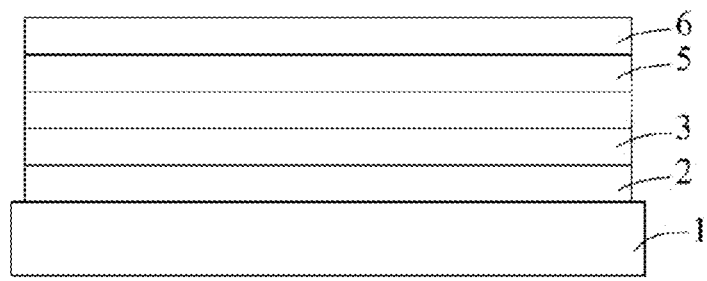
FIG. 5 is a schematic structural view of a conventional organic light-emitting diode display panel.

Please refer to FIG. 4 which is a schematic structural view of an organic light-emitting diode display panel of a third embodiment according to the present invention. As shown in FIG. 4, the organic light-emitting diode display panel according to the present invention includes a substrate on which a plurality of black silicon cones 33 is disposed. An OLED organic layer 31 is provided between two adjacent black silicon cones 33. In this embodiment, each black silicon cone 33 tapers upward and protrudes beyond the OLED organic layers 31.

Specifically, the black silicon cones 33 are provided in the third embodiment, and the OLED organic layers 31 are formed at the bottoms of the black silicon cones 33. Thus, the black silicon cones 33 still have excellent light absorbing capability to significantly reduce the reflectance of the ambient light and can avoid potential light interference from an adjacent OLED organic layer. Furthermore, the output angle of light and the light absorbing efficiency can be controlled by changing the structure of the black silicon cones 33 (such as the slope and the conic angle).

The advantages of the organic light-emitting diode display panel according to the present invention will now be set forth.

A black silicon structure is additionally provided by using the above organic light-emitting diode display panel. By disposing the black silicon structure around the OLED organic layer or by directly forming the OLED organic layer in the black silicon structure, the extremely high light absorbing capability of the black silicon structure is used to significantly reduce the reflectance of the ambient light, a clear display effect in a bright environment can be achieved under smaller luminance, reducing the luminance of the display panel and saving the power consumption.

Furthermore, by forming the black silicon structure and the OLED organic layer on the same level, the light absorbing capability is still very strong to significantly reduce the reflectance of the ambient light while reducing the number of films and the overall thickness of the panel and avoiding potential light interference from an adjacent OLED organic layer, meeting the trend of thinning the panels.

Furthermore, the output angle of light and the light absorbing efficiency can be controlled by changing the structure of the black silicon structure.

Although the invention has been described in connection with the embodiments shown in the accompanying drawings, a person having ordinary skill in the art can make various modifications to the invention based on the above descriptions. Therefore, some details of the embodiment should not be construed to restrict the invention. The scope of the invention is limited by the accompanying claims.

The invention claimed is:

1. An organic light-emitting diode display panel comprising:
    a substrate, with an OLED (organic light-emitting diode) light-emitting element mounted on the substrate, with the OLED light-emitting element comprising
    an OLED organic layer;
    an organic blocking layer disposed surrounding the OLED organic layer; and
    a black silicon structure, disposed on a top surface of the organic blocking layer without contacting the OLED organic layer, revealing the OLED organic layer, the black silicon structure being adapted to absorb ambient light to reduce a reflectance of the ambient light.

2. The organic light-emitting diode display panel according to claim 1, wherein the black silicon structure is a black silicon layer disposed on the OLED light-emitting element, and the black silicon structure includes an opening to reveal the OLED organic layer below the black silicon layer.

3. The organic light-emitting diode display panel according to claim 1, wherein the OLED organic layer is disposed in the black silicon structure, and the black silicon structure is a plurality of black silicon cones protruding beyond the OLED organic layer.

4. The organic light-emitting diode display panel according to claim 3, wherein the black silicon structure is formed on a silicon plate by etching, and the black silicon structure includes a surface having a micro structure with a geometric shape.

5. The organic light-emitting diode display panel according to claim 1, wherein a visible light reflectance of the black structure is smaller than 1%.

6. The organic light-emitting diode display panel according to claim 4, wherein the geometric shape of the micro structure is of a peak shape.

* * * * *